United States Patent [19]

Suvorov et al.

[11] Patent Number: 6,107,142
[45] Date of Patent: Aug. 22, 2000

[54] SELF-ALIGNED METHODS OF FABRICATING SILICON CARBIDE POWER DEVICES BY IMPLANTATION AND LATERAL DIFFUSION

[75] Inventors: Alexander Suvorov, Durham; John W. Palmour, Raleigh; Ranbir Singh, Cary, all of N.C.

[73] Assignee: Cree Research, Inc., Durham, N.C.

[21] Appl. No.: 09/093,207

[22] Filed: Jun. 8, 1998

[51] Int. Cl.[7] ................................................. H01L 21/336
[52] U.S. Cl. ..................... 438/285; 438/138; 438/268; 438/931; 438/519; 438/522
[58] Field of Search ..................... 438/285, 105, 438/138, 268, 931, DIG. 148, 519, 522

[56] References Cited

U.S. PATENT DOCUMENTS

| | | | |
|---|---|---|---|
| 3,629,011 | 12/1971 | Tohi et al. | 148/1.5 |
| 5,348,895 | 9/1994 | Smayling et al. | 438/234 |
| 5,384,270 | 1/1995 | Ueno | 438/285 |
| 5,459,089 | 10/1995 | Baliga | 438/931 |
| 5,510,281 | 4/1996 | Ghezzo et al. | 437/41 |
| 5,710,059 | 1/1998 | Rottner | 438/105 |
| 5,712,502 | 1/1998 | Mitlehner et al. | 257/341 |
| 5,804,483 | 9/1998 | Harris | 438/268 |
| 5,837,572 | 11/1998 | Gardner et al. | 438/199 |
| 5,849,620 | 12/1998 | Harris et al. | 438/285 |
| 5,851,908 | 12/1998 | Harris et al. | 438/520 |
| 5,877,041 | 3/1999 | Fuller | 438/105 |

FOREIGN PATENT DOCUMENTS

WO 98/02916  1/1998  WIPO.

OTHER PUBLICATIONS

Shenoy et al., "High–Voltage Double–Implanted Power MOSFET's in 6H–SiC", IEEE Electron Device Letters, vol., 18, No. 3, Mar. 1997, pp. 93–95.

International Search Report, PCT/US 99/12714, Sep. 29, 1999.

Primary Examiner—Michael Trinh
Attorney, Agent, or Firm—Myers Bigel Sibley & Sajovec

[57] ABSTRACT

Silicon carbide power devices are fabricated by implanting p-type dopants into a silicon carbide substrate through an opening in a mask, to form a deep p-type implant. N-type dopants are implanted into the silicon carbide substrates through the same opening in the mask, to form a shallow n-type implant relative to the p-type implant. Annealing is then performed at temperature and time that is sufficient to laterally diffuse the deep p-type implant to the surface of the silicon carbide substrate surrounding the shallow n-type implant, without vertically diffusing the p-type implant to the surface of the silicon carbide substrate through the shallow n-type implant. Accordingly, self-aligned shallow and deep implants may be performed by ion implantation, and a well-controlled channel may be formed by the annealing that promotes significant diffusion of the p-type dopant having high diffusivity, while the n-type dopant having low diffusivity remains relatively fixed. Thereby, a p-base may be formed around an n-type source. Lateral and vertical power MOSFETs may be fabricated.

46 Claims, 10 Drawing Sheets

SELF-ALIGNED METHODS OF FABRICATING SILICON CARBIDE POWER DEVICES BY IMPLANTATION AND LATERAL DIFFUSION

CROSS-REFERENCE TO RELATED APPLICATION

This application is related to concurrently filed U.S. application Ser. No. 09/093,208 filed Jun. 8, 1998, pending, to the present inventors, entitled "Methods of Fabricating Silicon Carbide Power Devices by Controlled Annealing", the disclosure of which is incorporated herein by reference.

FEDERALLY SPONSORED RESEARCH

This invention was made with Government support under Ballistic Missile Defense Organization Contract No. F33615-94-C-2500 and Office of naval Research Contract No. N00014-95-1-1302.

FIELD OF THE INVENTION

This invention relates to methods of fabricating power devices, and more particularly to methods of fabricating silicon carbide power devices.

BACKGROUND OF THE INVENTION

Power devices are widely used to carry large currents and support high voltages. Modern power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may include a lateral structure or a vertical structure. In a lateral structure, the drain, gate and source terminals are on the same surface of a substrate. In contrast, in a vertical structure, the source and drain are on opposite surfaces of the substrate.

One widely used silicon power MOSFET is the double diffused MOSFET (DMOSFET) which is fabricated using a double-diffusion process. In these devices, a p-base region and an n+ source region are diffused through a common opening in a mask. The p-base region is driven in deeper than the n+ source. The difference in the lateral diffusion between the p-base and n+ source regions forms a surface channel region. An overview of power MOSFETs including DMOSFETs may be found in the textbook entitled *"Power Semiconductor Devices"* by B. J. Baliga, published by PWS Publishing Company, 1996, and specifically in Chapter 7, entitled "Power MOSFET", Recent development efforts in power devices have also included investigation of the use of silicon carbide (SiC) devices for power devices. Silicon carbide has a wide bandgap, a high melting point, a low dielectric constant, a high breakdown field strength, a high thermal conductivity, and a high saturation electron drift velocity compared to silicon. These characteristics may allow silicon carbide power devices to operate at higher temperatures, higher power levels and with lower specific on-resistance than conventional silicon-based power devices. A theoretical analysis of the superiority of silicon carbide devices over silicon devices is found in a publication by Bhatnagar et al. entitled "Comparison of 6H-SiC, 3C-SiC and Si for Power Devices", IEEE Transactions on Electron Devices, Vol. 40, 1993, pp. 645–655. A power MOSFET fabricated in silicon carbide is described in U.S. Pat. No. 5,506,421 to the present invention.

Notwithstanding these potential advantages, it may be difficult to fabricate power devices including power MOSFETs in silicon carbide. For example, as described above, the double-diffused MOSFET (DMOSFET) is generally fabricated in silicon using a double diffusion process wherein the p-base region is driven in deeper than the n+ source. Unfortunately, in silicon carbide, the diffusion coefficients of conventional p- and n-type dopants are small compared to silicon, so that it may be difficult to obtain the required depths of the p-base and n+ source regions using acceptable diffusion times and temperatures. Ion implantation may also be used to implant the p-base and the n+ source. See, for example, "High-Voltage Double-Implanted Power MOSFET's in 6H-SiC" by Shenoy et al., IEEE Electron Device Letters, Vol. 18, No. 3, March 1997, pp. 93–95. However, it may be difficult to control the depth and lateral extent of ion implanted regions. Moreover, the need to form a surface channel surrounding the source region may require the use of two separate implantation masks. It may then be difficult to align the p-base and the source regions to one another, thereby potentially impacting the device performance.

SUMMARY OF THE INVENTION

It is therefore an object of the present invention to provide improved methods of fabricating silicon carbide power devices including silicon carbide power MOSFETs.

It is another object of the present invention to provide methods of fabricating silicon carbide power devices, including silicon carbide power MOSFETs that do not require separate masking of the source and p-base regions.

It is yet another object of the present invention to provide methods of fabricating silicon carbide power devices that can form channel regions that can be aligned to the source regions of the devices.

These and other objects are provided, according to the present invention, by methods of fabricating silicon carbide power devices in which p-type dopants are implanted into a silicon carbide substrate through an opening in a mask, to form a deep p-type implant, and n-type dopants are implanted into the silicon carbide substrates through the same opening in the mask, to form a shallow n-type implant relative to the p-type implant. Annealing is then performed at temperature and time that is sufficient to laterally diffuse the deep p-type implant to the surface of the silicon carbide substrate surrounding the shallow n-type implant, without vertically diffusing the p-type implant to the surface of the silicon carbide substrate through the shallow n-type implant. Accordingly, self-aligned shallow and deep implants may be provided by ion implantation, and a well-controlled channel may be formed by annealing that promotes significant diffusion of the p-type dopant having high diffusivity, while the n-type dopant having low diffusivity remains relatively fixed. A p-base thereby may be formed around an n-type source.

It has been found, according to the present invention, that the presence of the shallow n-type implant can block the vertical diffusion of the deep p-type implant to the surface of the silicon carbide substrate through the shallow n-type implant, while still allowing the deep p-type implant to diffuse laterally to the surface of the silicon carbide substrate surrounding the shallow n-type implant. In particular, while not wishing to be bound by any theory of operation, it is theorized that a nitrogen n-type implant can reduce carbon vacancies in the n-type region to prevent the deep p-type implant from diffusing into the n-type source region during annealing. Accordingly, high performance, self-aligned silicon carbide power devices may be formed.

It will be understood that the step of implanting p-type dopants may be performed prior to the step of implanting n-type dopants. Alternatively, the n-type dopants may be implanted first, and then electrically activated, for example, by annealing. The p-type dopants may then be implanted. It will also be understood that n-type dopants for silicon carbide typically comprise nitrogen, and that p-type dopants for silicon carbide may comprise boron or beryllium. Beryllium is presently preferred for the deep p-type implants of the present invention, because beryllium may be implanted deeply while still creating an abrupt junction with the silicon carbide substrate.

According to another aspect of the present invention, an aluminum well optionally is implanted at the surface of the silicon carbide substrate, electrically contacting the laterally diffused deep p-type implant. A nickel contact may then be used to contact the aluminum well and the shallow n-type implant, to provide an ohmic contact.

Silicon carbide lateral power MOSFETs may be fabricated according to the invention by implanting an aluminum well into a drift region at a surface of a silicon carbide substrate. The drift region at the surface of the silicon carbide substrate is masked to define a first pair of openings on the drift region, a respective one of which is on a respective opposite side of the aluminum well. P-type dopants are implanted into the silicon carbide substrate through the first pair of openings at implantation energy and dosage that form deep p-type implants. N-type dopants are implanted into the silicon carbide substrate through the first pair of openings at implant energy and dosage that form shallow n-type implants relative to the p-type implants. It will be understood that the p-type dopants may be implanted first, and the n-type dopants may be implanted second. Alternatively, the n-type dopants may be implanted first and activated, after which the p-type dopants may be implanted.

The drift region is then masked at the surface of the silicon carbide substrate, to define the second pair of openings on the drift region, a respective one of which is spaced apart from a respective shallow n-type implant and opposite the aluminum well. N-type dopants are implanted into the silicon carbide substrate through the second pair of openings, to define a pair of drain regions. Annealing is performed at temperature and time that is sufficient to laterally diffuse the respective deep p-type implants to the surface of the silicon carbide substrate surrounding the respective shallow n-type implants, without vertically diffusing the respective deep p-type implants to the surface of the silicon carbide substrate through the respective shallow n-type implants. A pair of channel regions is thereby formed in the laterally diffused p-type implants at the surface of the silicon carbide substrate, a respective one of which is on a respective opposite side of the aluminum well.

A pair of gate insulating regions is formed on the drift region at the surface of the silicon carbide substrate, a respective one of which contacts a respective one of the pair of channel regions. A common source contact, a pair of drain contacts and a pair of gate contacts is then formed on the shallow n-type implants and the aluminum well therebetween, on the drain regions and on the pair of gate insulating regions, respectively. A pair of silicon carbide lateral power MOSFETs having a common source, which may form the unit cell of a larger device, may thereby be formed.

It will be understood that the p-type dopants and the n-type dopants may each be implanted in a single implantation at a single energy and dose. Alternatively, multiple implantation energies and dosages may be used to form the shallow and/or deep implants. As was described above, nitrogen may be used for the n-type dopants. Boron, and more preferably beryllium, may be used for the p-type dopants.

It will also be understood by those having skill in the art that in the process described above, the aluminum well may be implanted after the drift region is masked and after the shallow and deep implants are implanted, such that the aluminum well is implanted between the shallow n-type implants. Moreover, the steps of first implanting p-type dopants and then implanting n-type dopants may be performed after the step of implanting n-type dopants. In other words, the drain regions may be formed prior to forming the source regions. In yet another alternative, the shallow-type implant for the sources and the n-type implant for the drains may be performed simultaneously.

Silicon carbide vertical power MOSFETs may be fabricated according to the invention, by implanting a pair of spaced apart aluminum wells into a drift region at a surface of a silicon carbide substrate. The drift region is masked at the surface of the silicon carbide substrate, to define a first pair of openings on the drift region between the pair of aluminum wells. P-type dopants are implanted into the silicon carbide substrate through the first pair of openings, to form a deep p-type implant. N-type dopants are implanted into the silicon carbide substrate through the first pair of openings, to form a shallow n-type implant. As was described above, the p-type dopants may be implanted prior to the n-type dopants, or the n-type dopants may be implanted and activated and then the p-type dopants may be implanted.

Annealing is then performed at temperature and time that is sufficient to laterally diffuse the respective p-type implants to the surface of the silicon carbide substrate surrounding the respective shallow n-type implants, without vertically diffusing the respective p-type implants to the surface of the silicon carbide substrate through the respective shallow n-type implants. A pair of channel regions is thereby formed in the laterally diffused p-type implants at the surface of the silicon carbide substrate, between the shallow n-type implants. A gate insulating region is formed at the surface of the silicon carbide substrate extending on and between the pair of channel regions. A pair of source contacts, a gate contact and a drain contact are formed on the respective shallow n-type implants and extending on the aluminum well adjacent thereto, on the gate insulating region, and on a second face of the silicon carbide substrate opposite the drift region, respectively.

As was described in connection with the lateral power MOSFET, single energies and dosages or multiple energies and dosages may be used for the implants. Nitrogen may be used for the n-type implants and boron, and more preferably beryllium, may be used for the p-type implants. The aluminum wells may be formed after implanting the p- and n-type dopants, such that the aluminum wells are implanted outside the first pair of openings. Accordingly, self-aligned methods may produce high performance silicon carbide devices, including lateral and vertical power MOSFETs.

DETAILED DESCRIPTION OF PREFERRED EMBODIMENTS

Figure 1A:
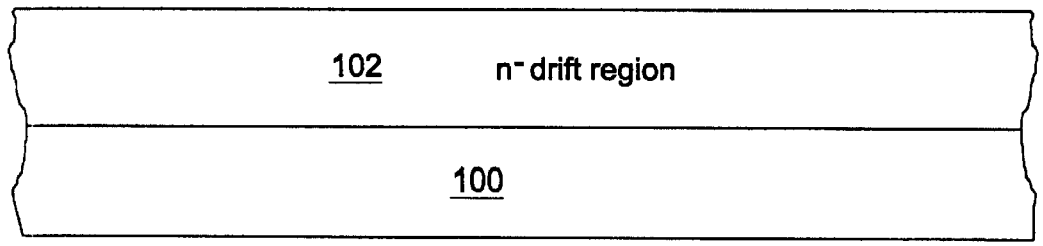
FIGS. 1A–1G are cross-sectional views of methods of fabricating silicon carbide lateral power MOSFETs according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Referring now to FIGS. 1A–1G, methods of fabricating a pair of lateral power MOSFETs according to the present invention will now be described. Since the lateral power MOSFETs employ self-aligned implantation and diffusion, the silicon carbide lateral power MOSFETs are also referred to as Lateral Implanted Diffused MOSFETs or LIDMOSFETs.

Referring now to FIG. 1A, a substrate such as a semi-insulating substrate 100 is provided with an n– drift region 102 thereon. It will be understood by those having skill in the art that substrate 100 may comprise doped or undoped silicon carbide or any other material that is lattice-matched to silicon carbide, including but not limited to gallium nitride. Substrate 100 is preferably semi-insulating, to prevent vertical conduction between adjacent devices through the substrate 100.

N– drift region 102 may be formed by epitaxial deposition, implantation or other conventional techniques. It will be understood that the combination of the substrate 100 and n– drift region 102 may also be referred to collectively as a substrate. N– drift region 102 may have carrier concentrations of from about $10^{12}$ cm$^{-3}$ to about $10^{17}$ cm$^{-3}$, and may have a thickness of from about 3 µm to about 500 µm. The substrate 100 may have a thickness of from about 100 µm to about 500 µm. The fabrication of substrate 100 and n– drift region 102 is well known to those having skill in the art and need not be described further herein.

Figure 1B:
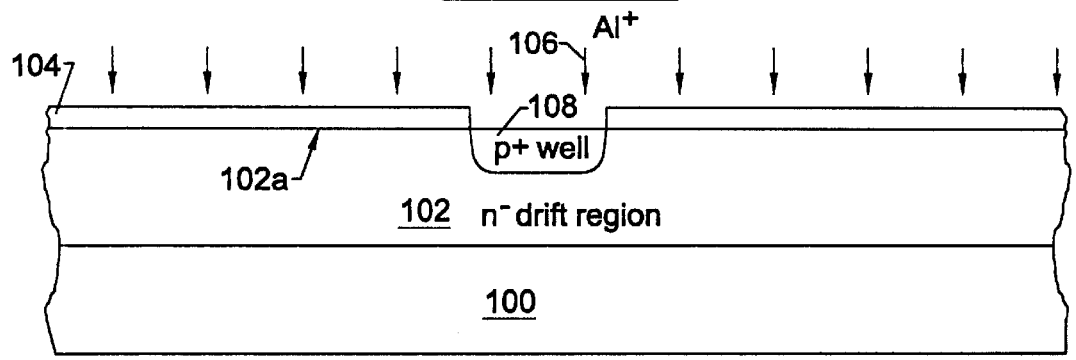

Referring now to FIG. 1B, a first mask 104 is patterned on the surface 102a of n– drift region 102. The first mask 104 may be formed of silicon dioxide or other conventional masking materials. As shown in FIG. 1B, the first mask 104 defines an opening that exposes a portion of the surface 102a of the n– drift region 102. As also shown in FIG. 1B, p-type ions, preferably aluminum ions 106, optionally are implanted into the drift region 102 through the surface 102a, to thereby form an optional p+ well 108 in drift region 102. As will be described later, p+ well 108 can improve the ohmic contact to a p-type diffused region. First mask 104 is then removed.

Figure 1C:
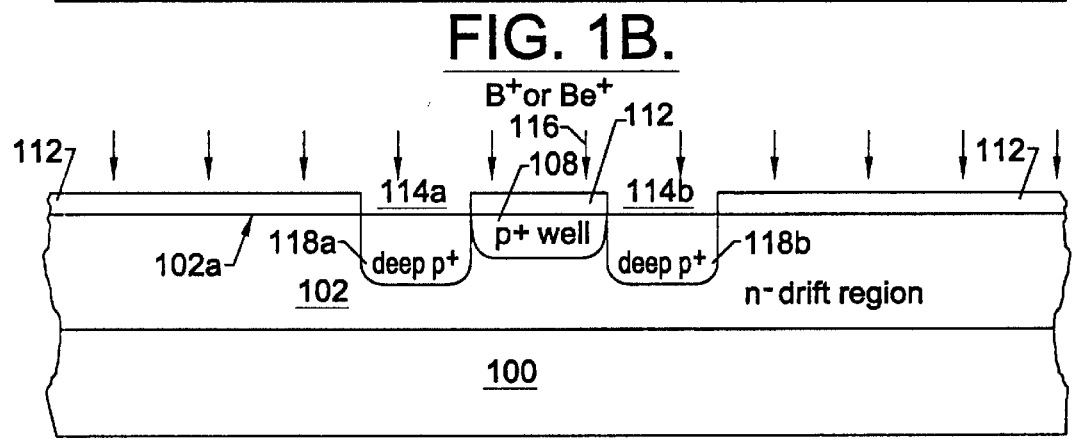

Referring now to FIG. 1C, a second mask 112, formed of silicon dioxide or other conventional masking materials, is patterned on n– drift region 102, to define a first pair of openings 114a and 114b on the drift region, a respective one of which is on a respective opposite side of the p+ well 108. Then, p-type dopants such as boron or beryllium ions 116 are implanted into the n– drift region 102 through the first pair of openings 114a and 114b, to form a pair of deep p+ implants 118a, 118b on the opposite sides of the p+ well 108. As will be described below, beryllium is preferred for the deep p+ implants, because beryllium can form abrupt junctions with the drift region 102. It will also be understood that the deep p+ implants 118a and 118b may be formed using a single implantation and dosage, for example by implanting boron ions at 180 keV energy and $4 \times 10^{15}$ cm$^{-2}$ dosage, to provide a carrier concentration of about $10^{16}$ cm$^{-3}$. Beryllium also can be implanted at 40 keV energy and $3.2 \times 10^{15}$ cm$^{-2}$ dosage. Alternatively, multiple dosages and/or energies may be used.

Figure 1D:
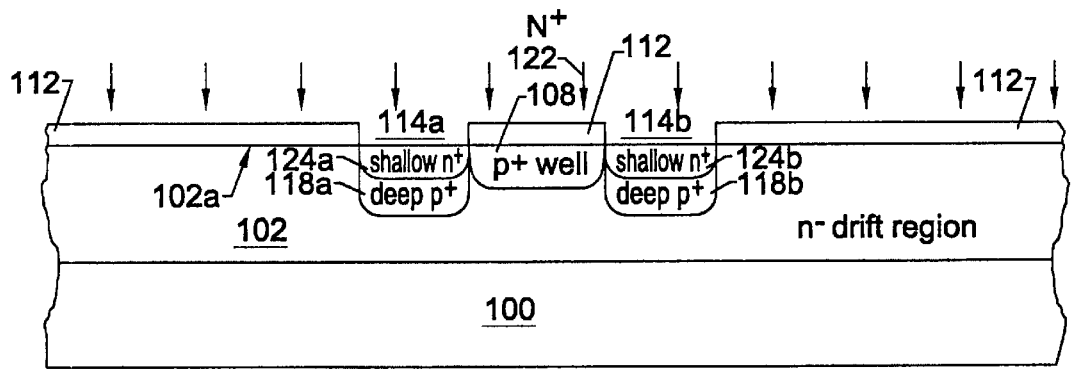

Referring now to FIG. 1D, the second mask 112 is not removed and n-type ions 122 such as nitrogen are implanted through the first and second openings 114a and 114b, to form a pair of shallow n+ implants 124a, 124b. Single or multiple implants may be used, as described below. Carrier concentrations greater than about $10^{18}$ cm$^{-3}$ may be provided. It will be understood that since the same second mask 112 is used for the deep p+ implants of FIG. 1C and the shallow n+ implants of FIG. 1D, these implants may be self-aligned to one another.

Figure 1E:
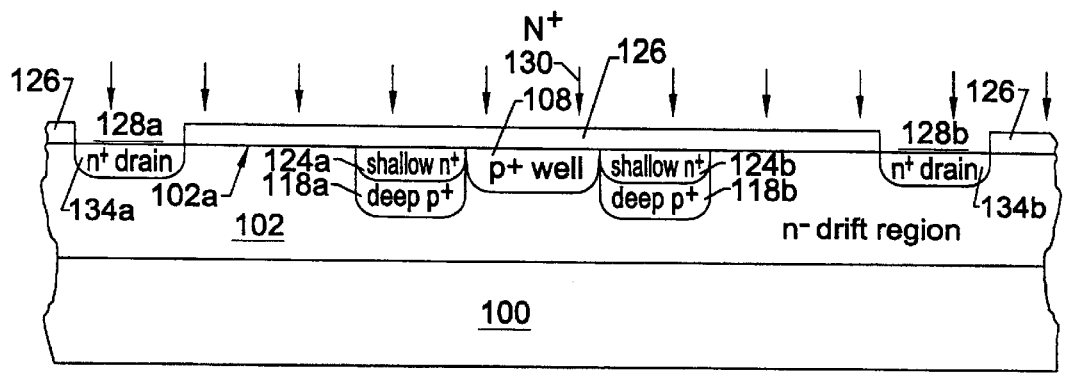

Referring now to FIG. 1E, the second mask 112 is removed and a third mask 126 is formed. As shown in FIG. 1E, the third mask 126, which may be formed of silicon dioxide or other conventional masking materials, defines a second pair of openings 128a and 128b on the surface 102a of the drift region 102. The second pair of openings 128a, 128b are spaced apart from the respective shallow n-type implants 124a, 124b and are opposite the p+ well 108.

Still referring to FIG. 1E, p-type dopants 130 such as nitrogen are implanted into the n– drift region 102 through the second pair of openings 128a, 128b, to form a pair of n+ drain regions 134a, 134b. The third mask 126 may then be removed.

It will be understood by those having skill in the art that the order of steps in FIGS. 1B, 1C, 1D and 1E may be changed. Thus, for example, the p+ well 108 of FIG. 1B may be formed after forming the deep p+ implants 118a, 118b of FIG. 1C, and may also be formed after forming the shallow n+ implants 124a, 124b of FIG. 1D. The p+ well of FIG. 1B may also be formed after forming the n+ drain regions 134a, 134b of FIG. 1E. Moreover, the deep p+ implants 118a, 118b of FIG. 1C may be formed after forming the shallow n+ implants 124a, 124b of FIG. 1D. If this is the case, an anneal is preferably performed after implanting the shallow n+ implants 124a, 124b, at temperature and time that can be tolerated by the mask and that is sufficient to electrically activate the n-type dopants.

The n+ drain regions 134a, 134b of FIG. 1E also may be formed prior to forming the shallow n+ implants 124a, 124b of FIG. 1D, the deep p+ implants 118a, 118b of FIG. 1C and/or the p+ well 108 of FIG. 1B. The n+ drain regions 134a, 134b may also be implanted simultaneously with the shallow n+ regions 124a, 124b of FIG. 1D. If the n+ drain regions 134a, 134b are implanted simultaneously with the shallow n+ implants 124a, 124b, the second pair of openings 128a, 128b may be formed in second mask 112, to allow the simultaneous implant.

Figure 1F:
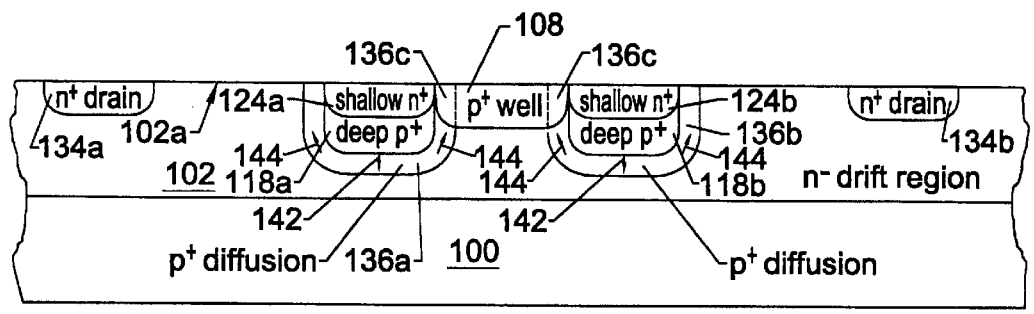

Referring now to FIG. 1F, an anneal is performed at temperature and time that is sufficient to laterally diffuse the deep p-type implants 118a, 118b, to the surface 102a of the silicon carbide substrate surrounding the respective shallow n-type implants 124a, 124b, without vertically diffusing the respective deep p-type implants to the surface of the silicon carbide substrate through the respective shallow n-type implants 124a, 124b. For example, vertical diffusion of the deep p-type implants into the shallow n-type implants 124a, 124b, to less than 0.5% of the thickness of the shallow n-type implants 124a, 124b preferably takes place. Annealing may take place, for example, at 1600° C. for five minutes, to diffuse the deep p-type implants about 1 μm. However, other annealing times and temperatures may be used. For example, annealing times between about 1500° C. and about 1600° C. and times between about 1 minutes and 30 minutes may be used to diffuse boron from the deep p-type implants to distances of between about 0.5 μm and 3 μm in the vertical and lateral directions.

Accordingly, a pair of p+ diffusion regions 136a, 136b are formed by diffusing p+ dopants from the deep p+ implants 118a, 118b vertically away from surface 102a, as shown by arrows 142, and laterally and vertically towards the surface 102a, as shown by arrows 144. As also shown by arrows 144, the lateral diffusion diffuses around the shallow n+ implants 124a, 124b to the surface 102a of the drift region opposite the p+ well 108. As shown by the regions 136c, lateral diffusion into p+ well 108 may also take place, to further improve the ohmic contact.

Figure 1G:
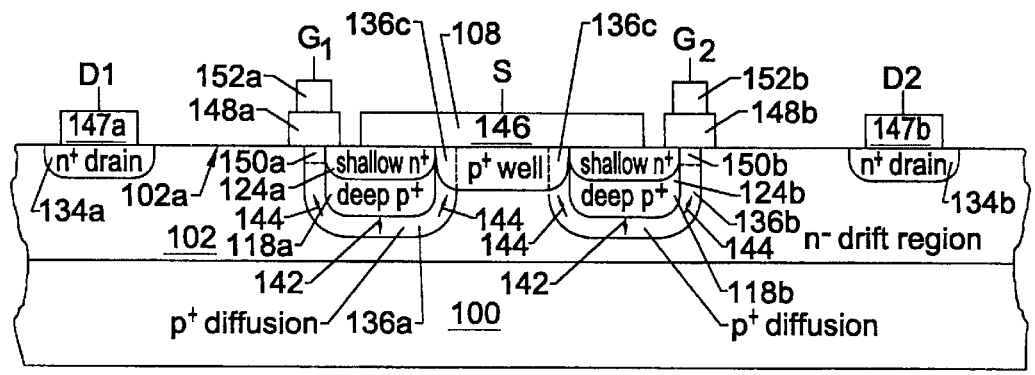

Finally, referring to FIG. 1G, an insulated gate and source and drain contacts are formed. For example, a source contact 146 and a pair of spaced apart drain contacts 147a, 147b may be formed by blanket depositing nickel and then patterning the blanket deposited nickel. The source contact 146 is labeled S in FIG. 1G and the drain contacts 147a, 147b are labeled D1 and D2 in FIG. 1G. As shown in FIG. 1G, the source contact provides a common source contact that extends on the shallow n+ implants 124a, 124b and on the p+ well 108. The drain contacts 147a, 147b electrically contact the n+ drains 134a, 134b respectively.

Continuing with the description of FIG. 1G, a pair of gate insulating regions 148a, 148b, for example silicon dioxide, are formed on the surface 102a of n– drift region 102, a respective one of which contacts a respective portion of the p+ diffusion region 136a, 136b that has laterally diffused to the surface of the n– drift region 102, opposite the p+ well 108. Thus, these regions form a pair of channel regions 150a, 150b in the laterally diffused p-type implants at the surface of the silicon carbide substrate. Self-aligned channel regions, that are aligned to the source regions, are thereby formed. A pair of gate contacts 152a, 152b is then formed on the respective pair of gate insulating regions 148a, 148b. The gate contacts are labeled G1 and G2 in FIG. 1G and may comprise nickel.

It will also be understood that the formation of insulating regions and contacts described in FIG. 1G may be performed in different sequences from that described. For example, the gate contacts 152a, 152b may be formed simultaneously with the source contact 146 and the drain contacts 147a, 147b. Preferably, the gate contacts 152a, 152b are formed prior to forming the source contact 146 and the drain contacts 147a, 147b.

Figure 2:
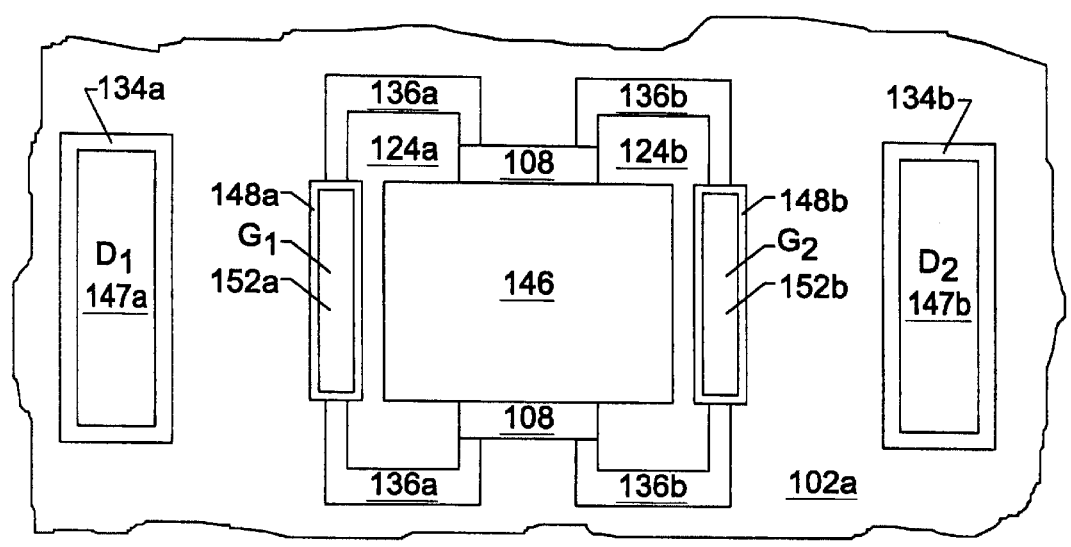
FIG. 2 is a top view of FIG. 1G.

FIG. 2 is a top view of the completed device of FIG. 1G. As shown, a pair of common source LIDMOSFETs are formed. It will be understood that the pair of common source LIDMOSFETs may be replicated on a silicon carbide substrate to form an array of unit cells. Moreover, the left half or right half of FIGS. 1A–1G may also be replicated if unit cells that do not include common sources are desired.

Referring now to FIGS. 3A–3G, methods of forming silicon carbide vertical power MOSFETs according to the present invention will now be described. Since these vertical power MOSFETs are fabricated using implantation and diffusion, they are also referred to herein as a silicon carbide Vertical Implanted Diffused MOSFETs (VIDMOSFETs).

Figure 3A:
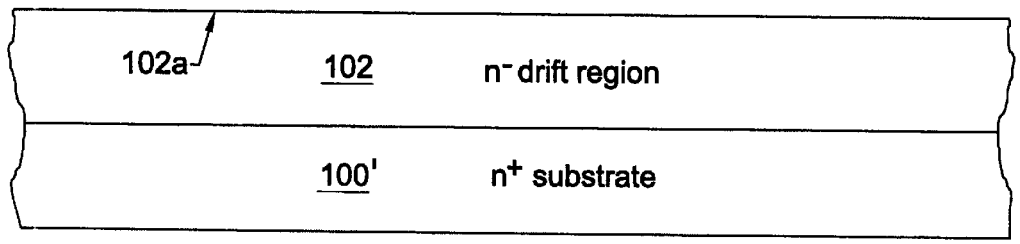
FIGS. 3A–3G are cross-sectional views of methods of fabricating silicon carbide vertical power MOSFETs according to the present invention.

Referring now to FIG. 3A, a silicon carbide substrate 100' including an n– drift region 102 is provided. Since FIGS. 3A–3G illustrate fabrication of a vertical MOSFET that includes conduction through the substrate, substrate 100' is preferably an n+ conductive silicon carbide substrate that is fabricated using known techniques. The n+ conductive silicon carbide substrate may have a carrier concentration of between about $10^{16}$ cm$^{-3}$ and about $10^{19}$ cm$^{-3}$. N– drift region 102 may also be fabricated as was described in connection with FIG. 1A. It will also be understood that the combination of n+ substrate 100' and n– drift region 102 may also be referred to as a substrate, as was already described.

Figure 3B:
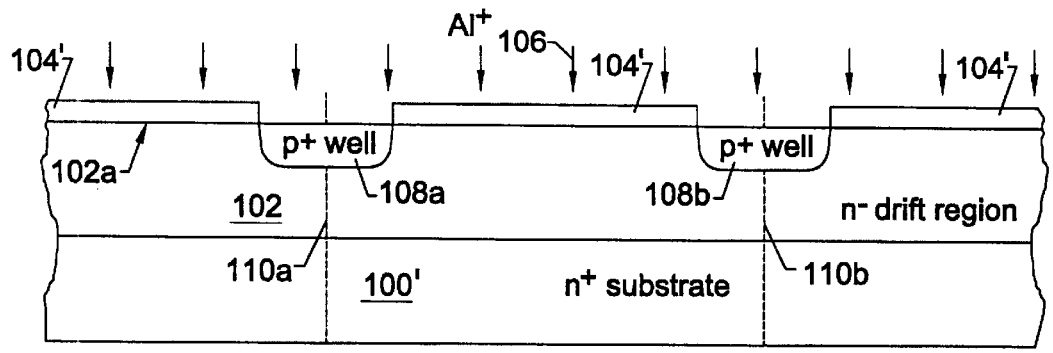

Referring now to FIG. 3B, a pair of spaced apart p+ wells 108a, 108b are implanted into the drift region 102 at the surface 102a of the silicon carbide substrate. A pair of spaced apart p+ wells 108a, 108b are implanted into surface 102a of drift region 102 using first mask 104', that includes a pair of openings therein, in a manner described in connection with FIG. 1D. As was also described, the p+ well is preferably formed by implanting aluminum ions 106.

It will be understood by those having skill in the art that the vertical silicon carbide MOSFETs are generally replicated in a unit cell. Accordingly, the unit cell between lines 110a and 110b will be described and labeled in FIGS. 3B–3G and 4. For ease of illustration, the replicated unit cells outside lines 110a and 110b will not be labeled.

Figure 3C:
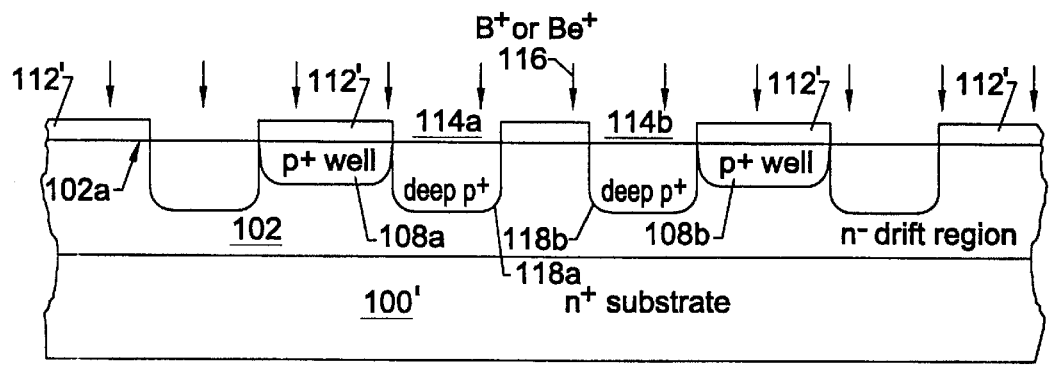

Referring now to FIG. 3C, a pair of openings 114a, 114b are formed as was described in connection with FIG. 1C, except a modified second mask 112' is used to form these openings between the pair of aluminum wells 108a, 108b. Boron, and more preferably beryllium, ions 116 are then implanted to form deep p+ implants 118a, 118b as was described in connection with FIG. 1C.

Figure 3D:
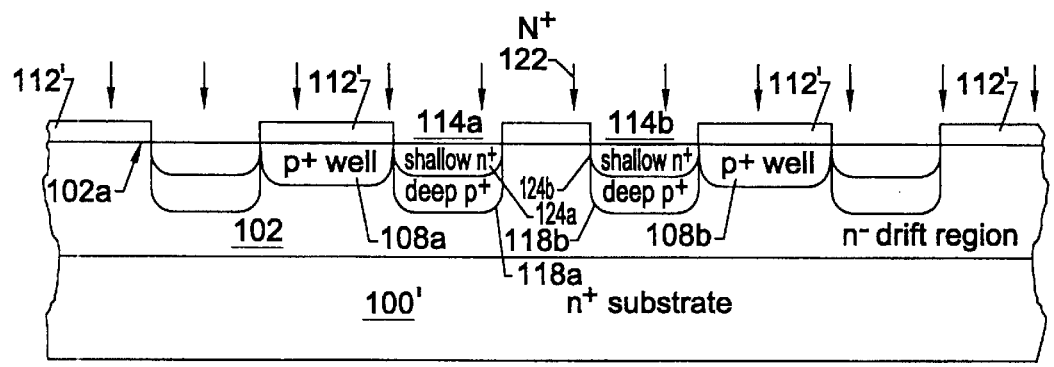

Referring now to FIG. 3D, using the same second mask 112', shallow n+ implants 124a, 124b are implanted using for example nitrogen ions 122, as was already described in connection with FIG. 1D.

Figure 3E:
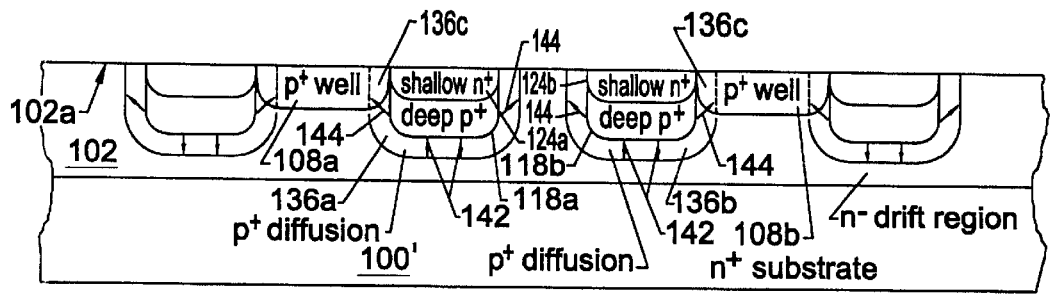

Referring now to FIG. 3E, an anneal is performed in a manner that was already described in connection with FIG. 1F. It will be understood that since FIGS. 3A–3G illustrate fabrication of a vertical MOSFET, the fabrication of a pair of n+ drains 134a, 134b as shown in FIG. 1E, may be omitted. It will also be understood that the order of fabricating the p+ wells 108a, 108b, the deep p+ implants 118a, 118b and the shallow n+ implants 124a, 124b may be changed, as was already described in connection with FIGS. 1B–1F.

Figure 3F:
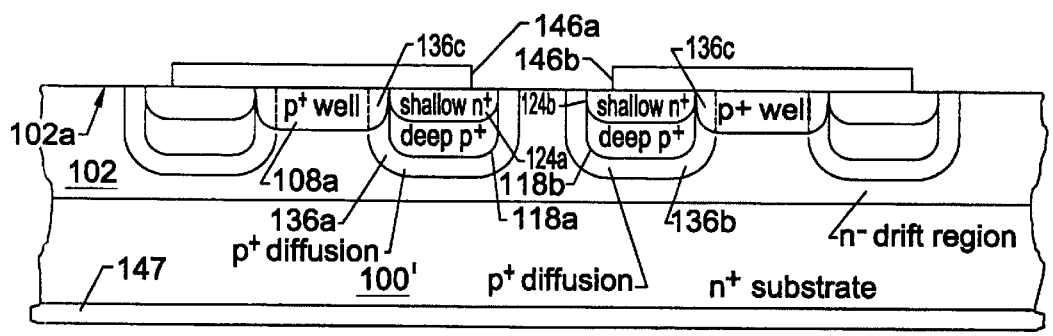

Referring now to FIG. 3F, a pair of source contacts 146a, 146b, for example comprising nickel, are formed on the shallow n-type implants 124a, 124b and extending on the p-well 108a, 108b adjacent thereto, as was described in connection with FIG. 1G. A drain contact 147 is formed on a face of the silicon carbide substrate 100 that is opposite n– drift region 102. Drain contact 147 also preferably comprises nickel.

Figure 3G:
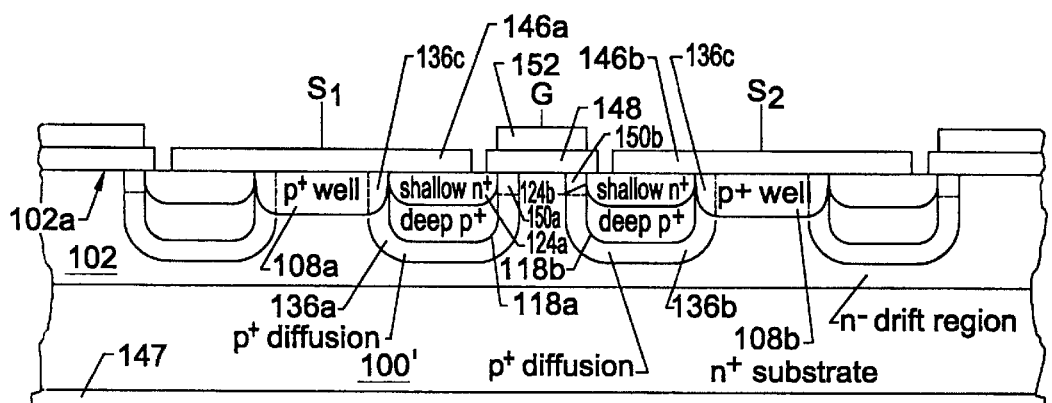

Finally, as shown in FIG. 3G, a gate insulating region 148 is formed at the surface 102a of the drift region 102, extending between and on the deep p-type implants 136a, 136b that have diffused to the surface of the silicon carbide substrate, surrounding the respective shallow n-type implants. Accordingly, these regions form a pair of channel regions 150a, 150b in the laterally diffused p-type implants at the surface 102a of the silicon carbide substrate between the shallow n-type implants. A gate contact 152, for example comprising nickel, is formed on the gate insulating region 148. As was described in connection with FIG. 1G, the order of forming the gate insulating region 148 and the source, drain and gate contacts may be varied.

Figure 4:
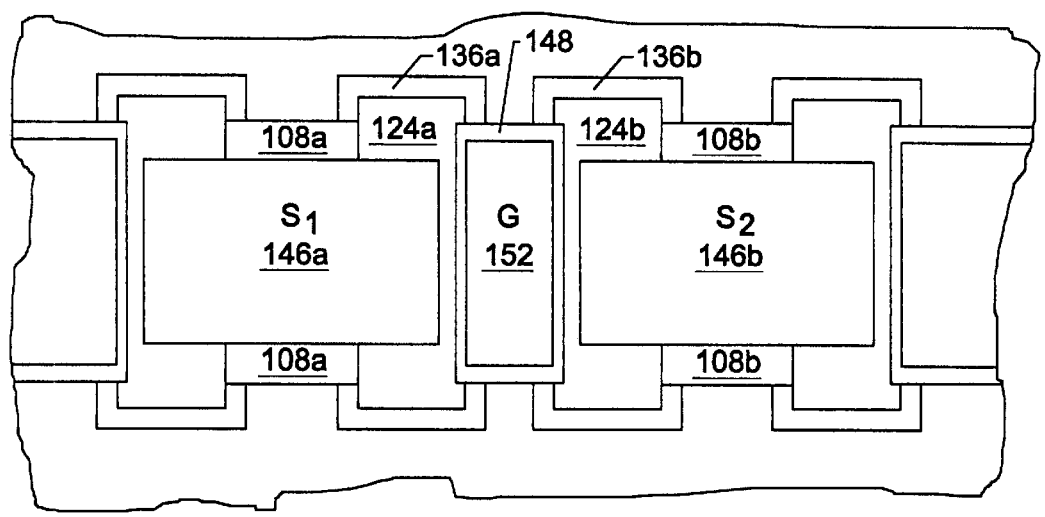
FIG. 4 is a top view of FIG. 3G.

FIG. 4 is a top view of the completed structure. The drain contact on the bottom surface is not shown.

Additional considerations in the fabrication of silicon carbide power devices according to the present invention will now be described.

The p+ well 108 of FIGS. 1B–1G and 108a, 108b of FIGS. 3B–3G may be formed by room temperature or high temperature implantation using a first implant of aluminum at 25 keV energy and $2 \times 10^{15}$ cm$^{-2}$ dose and a second implant of aluminum at 90 keV energy and $4 \times 10^{15}$ cm$^{-2}$ dose, to produce an aluminum well having 0.1 µm depth with a carrier concentration of $5 \times 10^{20}$ cm$^{-3}$. The deep p+ regions 118a, 118b of FIGS. 1C–1G and 3C–3G may be fabricated by implanting boron at room temperature at a first energy of 450 keV and dose of $3.2 \times 10^{14}$ cm$^{-2}$ and a second energy of 370 keV and dose of $1.5 \times 10^{14}$ cm$^{-2}$, to produce a carrier concentration of $2 \times 10^{18}$ cm$^{-3}$ at a depth from 0.4 µm to 1.0 µm. Finally, the shallow n+ implants 124a, 124b of FIGS. 1D–1G and FIGS. 3D–3G may be fabricated using four implants of nitrogen at room temperature. The first implant is made at an energy of 25 keV and a dose of $3 \times 10^{14}$ cm$^{-2}$. The second, third and fourth implants are made at energies of 60 keV, 120 keV and 200 keV respectively and $6 \times 10^{14}$ cm$^{-2}$, $8 \times 10^{14}$ cm$^{-2}$ and $1 \times 10^{15}$ cm$^{-2}$ respectively, to produce a shallow n+ region having carrier concentration of $1 \times 10^{20}$ cm$^{-3}$ at a depth from 0 to 0.4 µm. After annealing at 1600° C. for five minutes, channel regions 150a, 150b of FIGS. 1G and 3G may be produced having a width of 0.3 µm at the substrate surface 102a. The depth of the p+ diffusions 136a, 136b may extend 1.5 µm from the substrate surface 102a.

Figure 5:
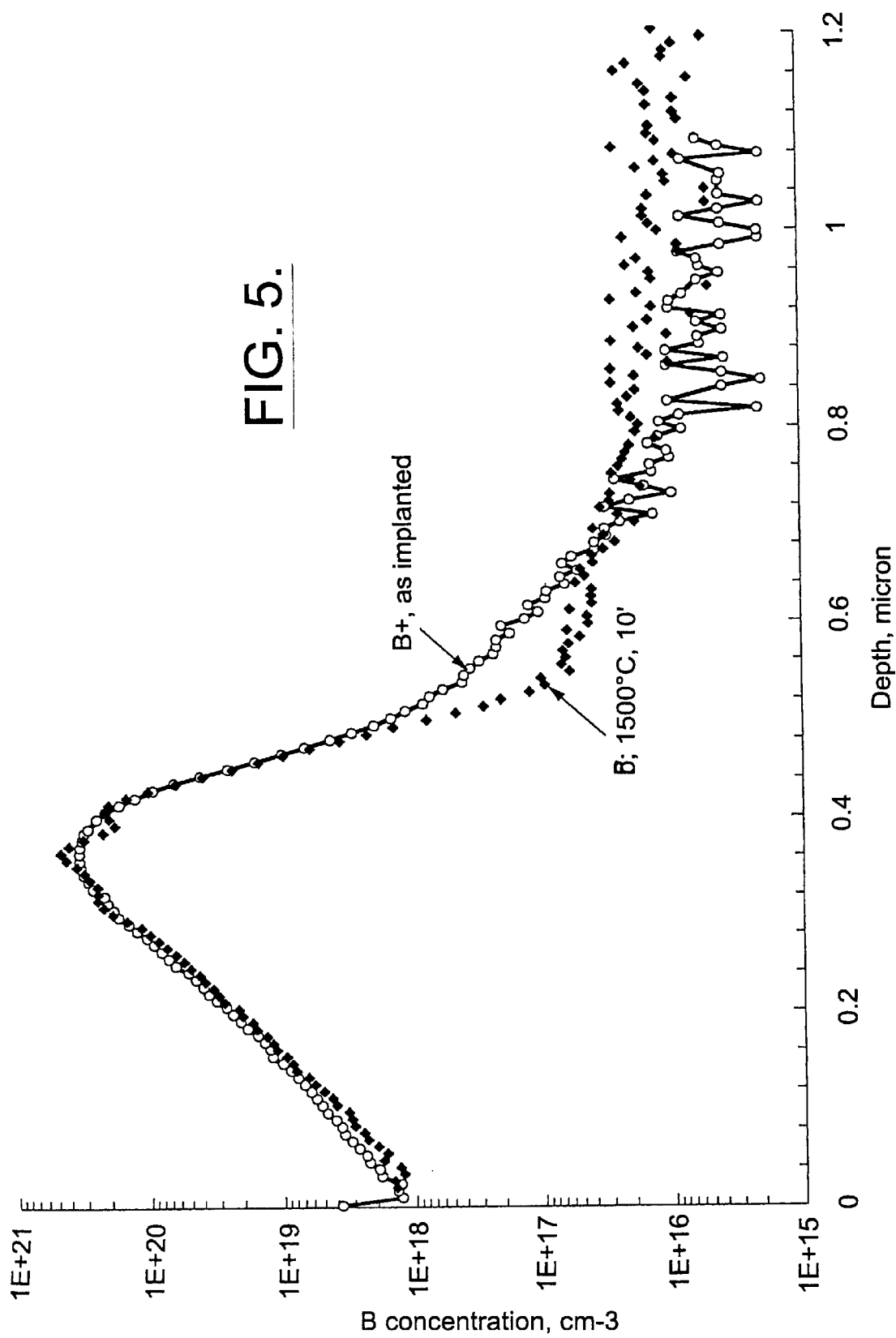
FIG. 5 graphically illustrates boron diffusion during annealing.
Figure 6:
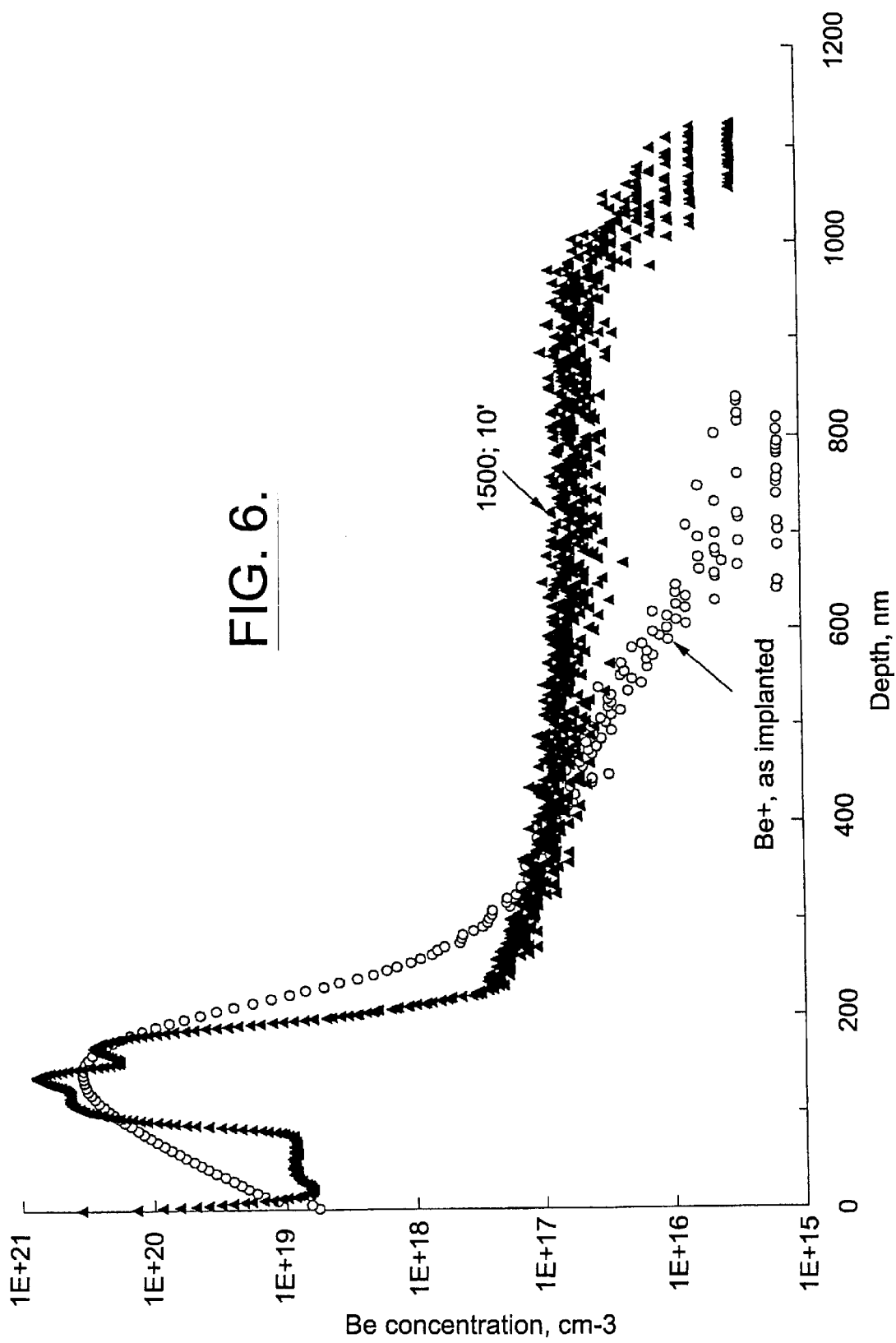
FIGS. 6 and 7 graphically illustrate beryllium diffusion during annealing.

As was described above, beryllium is preferred for the deep p+ implants, because beryllium can form abrupt junctions with the drift region 102. FIGS. 5 and 6 compare diffusion of boron and beryllium respectively after annealing.

More specifically, FIG. 5 illustrates boron concentration versus depth for boron as implanted into 4H-SiC at room temperature at energy of 180 keV and dosage of $4 \times 10^{15}$ cm$^{-2}$, to provide a boron carrier concentration of $2.3 \times 10^{15}$ cm$^{-2}$. Annealing is performed at 1500° C. for ten minutes. As shown in FIG. 5, after annealing, the as-implanted boron diffuses and only gradually falls off.

In contrast, as shown in FIG. 6, beryllium is implanted in a 4H-SiC substrate at energy of 40 keV and dosage $3.2 \times 10^{15}$ cm$^{-2}$ at room temperature, to provide a beryllium concentration of $1 \times 10^{19}$ cm$^{-3}$. As shown in FIG. 6, after annealing at 1500° C. for ten minutes, the as-implanted beryllium diffuses at a relatively constant carrier concentration with a rapid falloff at about 1000 nm. Accordingly, a deeper, more uniform diffusion may take place with beryllium, with an abrupt junction being formed with the drift region compared to boron.

Figure 7:
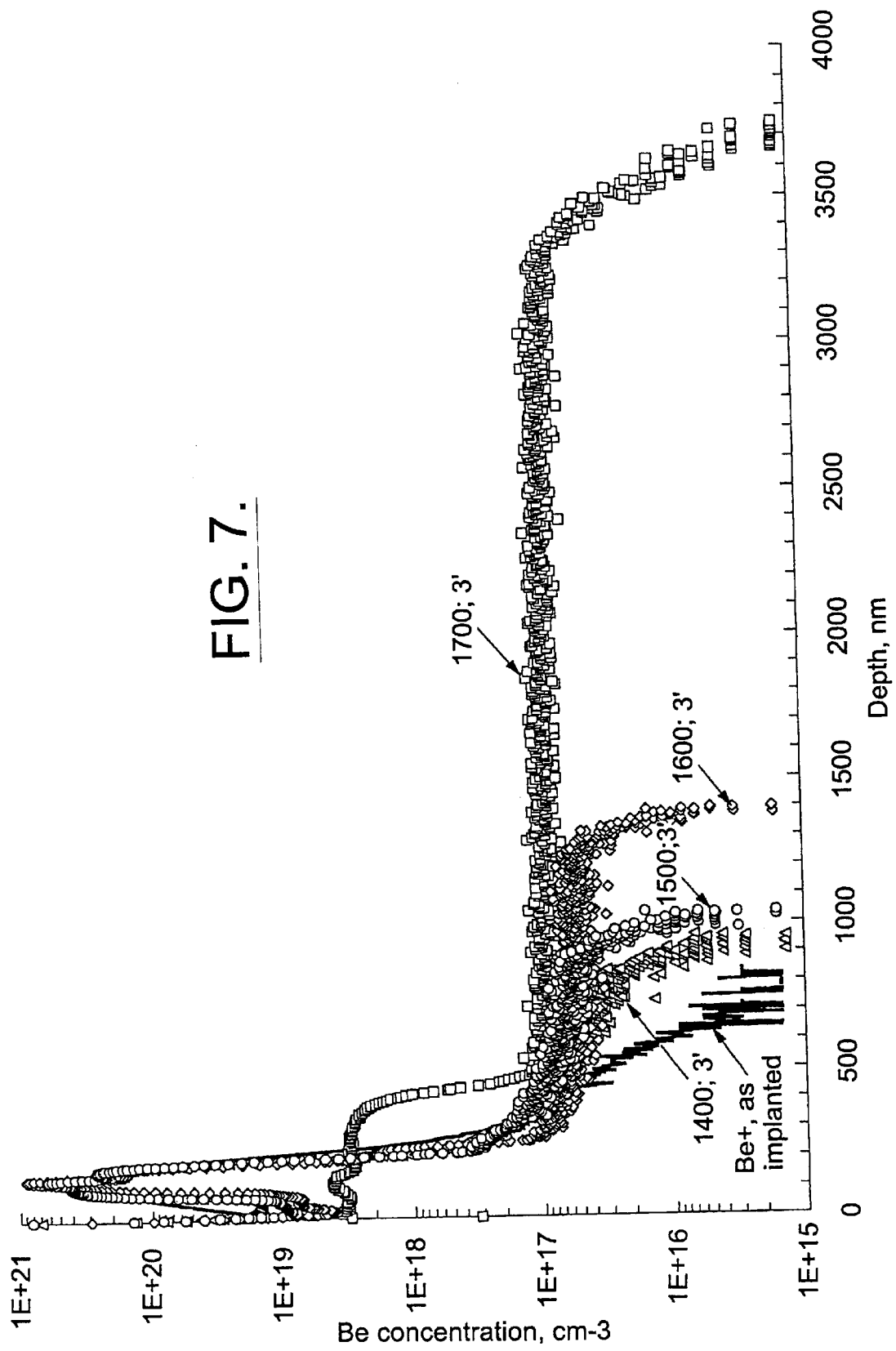

FIG. 7 further illustrates diffusion of implanted beryllium during annealing. The beryllium is implanted under the conditions described for FIG. 6. As shown in FIG. 7, as the annealing temperature increases from 1400° C. to 1700° C. at a constant annealing time of three minutes, the diffusion depth continues to increase while remaining uniform and exhibiting an abrupt falloff. Accordingly, beryllium may be preferred over boron.

Figure 8:
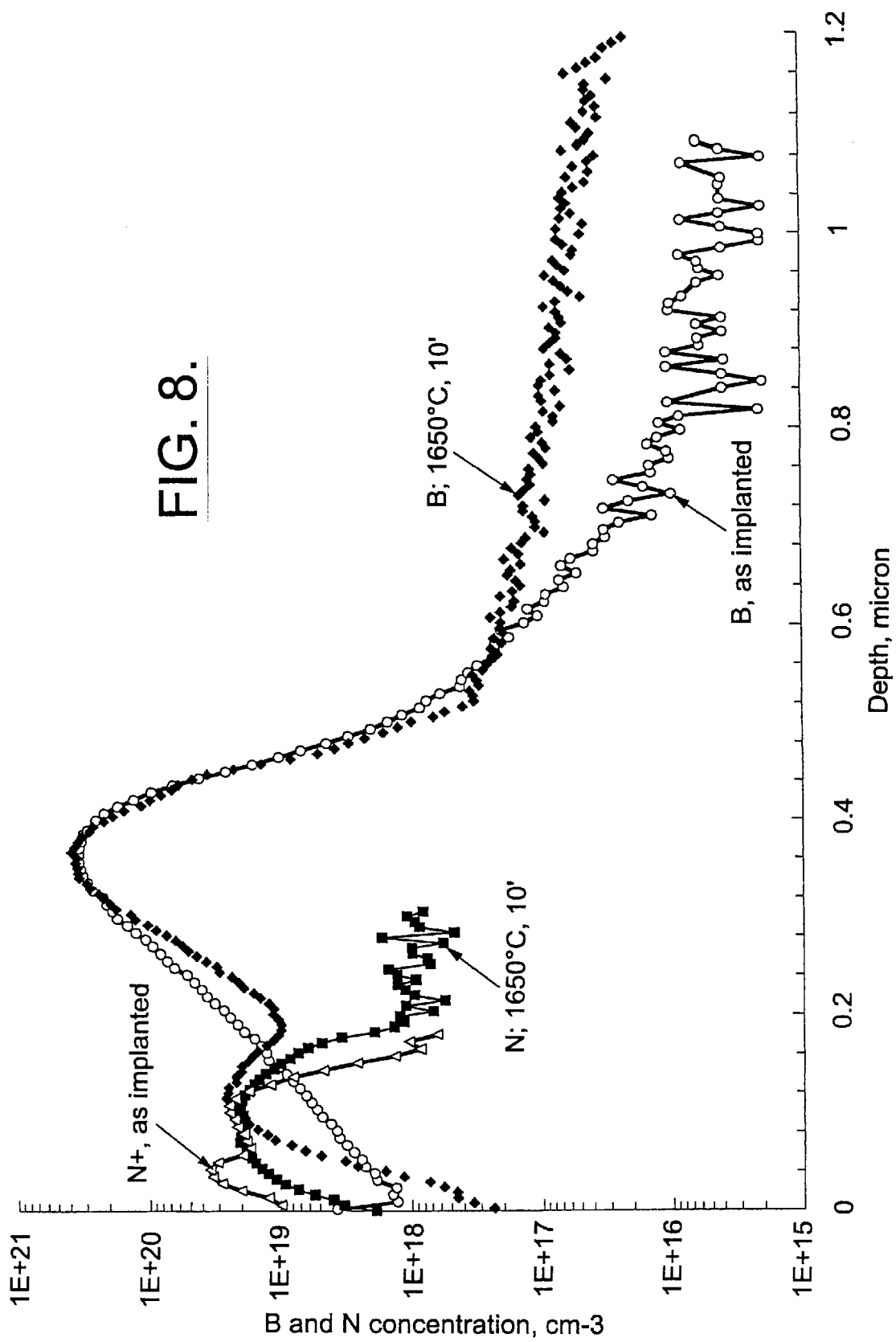
FIG. 8 graphically illustrates diffusion of nitrogen and boron during annealing.

Referring now to FIG. 8, diffusion of implanted boron and nitrogen during an anneal of ten minutes at 1650° C. is illustrated. In FIG. 8, boron is implanted at room temperature at energy of 180 keV and dosage of $4 \times 10^{15}$ cm$^{-2}$. Two nitrogen implants are performed at energies of 25 and 60 keV and dosages of $1.5 \times 10^{14}$ cm$^{-2}$ and $2.5 \times 10^{14}$ cm$^{-2}$ respectively. As shown in FIG. 8, very little nitrogen diffusion takes place during the ten minute anneal at 1650° C. However, a great deal of boron diffusion takes place during this anneal. It should be noted however, that although the boron diffuses deeper, away from the shallow nitrogen implant, the boron does not diffuse to the surface of the silicon carbide substrate through the shallow nitrogen implant.

Accordingly, high performance silicon carbide power devices may be fabricated with self-aligned source and p-base regions and with a uniform p-channel. An inversion layer may be formed laterally across the surface of the substrate. A retrograde profile of the p-base may be obtained for a lower threshold voltage and a higher activation of the implanted n+ source. Since aluminum need not be used for the p-base region, a higher quality and/or thinner gate oxide region may be obtained, which can further lower the threshold voltage.

Moreover, high electric fields need not be present at the p-base, so that problems related to scattering or field concentration may be avoided. No sharp corners need be present in the n+ oxide, to thereby allow reduction in hot electron injection during on-state operation. High mobility in the channel may also be provided since the diffused channel can provide a reactive ion etch damage-free silicon carbide/silicon dioxide interface that can provide low interface trap density and fixed charges.

Finally, simplified fabrication may be provided by eliminating at least one mask and providing self-alignment which reduces the need for tight alignment tolerances. Accordingly, improved methods of fabricating silicon carbide power devices may be provided.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a silicon carbide power device comprising the steps of:

masking a surface of a silicon carbide substrate to define an opening at the surface;

first implanting p-type dopants into the silicon carbide substrate through the opening at implantation energy and dosage that form a deep p-type implant;

then implanting n-type dopants into the silicon carbide substrate through the opening at implantation energy and dosage that form a shallow n-type implant relative to the deep p-type implant;

annealing at temperature and time that is sufficient to laterally diffuse the deep p-type implant to the surface of the silicon carbide substrate surrounding the shallow n-type implant, without vertically diffusing the deep p-type implant to the surface of the silicon carbide substrate through the shallow n-type implant; and implanting a p-type well at the surface of the silicon carbide substrate, electrically contacting the laterally diffused deep p-type implant.

2. A method according to claim 1:

wherein the step of first implanting p-type dopants comprises the step of implanting p-type dopants into the silicon carbide substrate through the opening at a plurality of implantation energies and dosages that form a deep p-type implant; and wherein the step of then implanting n-type dopants comprises the step of then implanting n-type dopants into the silicon carbide substrate through the opening at a plurality of implantation energies and dosages that form a shallow n-type implant relative to the deep p-type implant.

3. A method according to claim 2:

wherein the step of first implanting p-type dopants comprises the step of implanting boron into the silicon carbide substrate through the opening at a plurality of implantation energies and dosages that form a deep p-type implant; and wherein the step of then implanting n-type dopants comprises the step of then implanting nitrogen into the silicon carbide substrate through the opening at a plurality of implantation energies and dosages that form a shallow n-type implant relative to the deep p-type implant.

4. A method according to claim 1 wherein the step of first implanting p-type dopants comprises the step of implanting boron, and wherein the step of then implanting n-type dopants comprises the step of implanting nitrogen.

5. A method according to claim 1 wherein the step of first implanting p-type dopants comprises the step of implanting beryllium, and wherein the step of then implanting n-type dopants comprises the step of implanting nitrogen.

6. A method according to claim 1 wherein the p-type well comprises an aluminum well.

7. A method of fabricating a silicon carbide power device comprising the steps of:

masking a surface of a silicon carbide substrate to define an opening at the surface;

first implanting n-type dopants into the silicon carbide substrate through the opening at implantation energy and dosage that form a shallow n-type implant;

electrically activating the n-type dopants;

then implanting p-type dopants into the silicon carbide substrate through the opening at implantation energy and dosage that form a deep p-type implant relative to the shallow n-type implant;

annealing at temperature and time that is sufficient to laterally diffuse the deep p-type implant to the surface of the silicon carbide substrate surrounding the shallow n-type implant, without vertically diffusing the deep p-type implant to the surface of the silicon carbide substrate through the shallow n-type implant; and implanting a p-type well at the surface of the silicon carbide substrate, electrically contacting the laterally diffused deep p-type implant.

8. A method according to claim 7:

wherein the step of first implanting n-type dopants comprises the step of implanting n-type dopants into the silicon carbide substrate through the opening at a plurality of implantation energies and dosages that form a shallow n-type implant; and wherein the step of then implanting p-type dopants comprises the step of then implanting p-type dopants into the silicon carbide substrate through the opening at a plurality of implantation energies and dosages that form a deep p-type implant relative to the shallow n-type implant.

9. A method according to claim 8:

wherein the step of first implanting n-type dopants comprises the step of implanting nitrogen into the silicon carbide substrate through the opening at a plurality of implantation energies and dosages that form a shallow n-type implant; and wherein the step of then implanting p-type dopants comprises the step of then implanting boron into the silicon carbide substrate through the opening at a plurality of implantation energies and dosages that form a deep p-type implant relative to the shallow n-type implant.

10. A method according to claim 7 wherein the step of first implanting n-type dopants comprises the step of implanting nitrogen, and wherein the step of then implanting p-type dopants comprises the step of implanting boron.

11. A method according to claim 7 wherein the step of first implanting n-type dopants comprises the step of implanting nitrogen, and wherein the step of then implanting p-type dopants comprises the step of implanting beryllium.

12. A method according to claim 7 wherein the p-type well comprises an aluminum well.

13. A method of fabricating a silicon carbide lateral power MOSFET comprising the steps of:

implanting an aluminum well into a drift region at a surface of a silicon carbide substrate;

masking the drift region at the surface of the silicon carbide substrate to define a first pair of openings on the drift region, a respective one of which is on a respective opposite side of the aluminum well;

first implanting p-type dopants into the silicon carbide substrate through the first pair of openings at implantation energy and dosage that form deep p-type implants;

then implanting n-type dopants into the silicon carbide substrate through the first pair of openings at implantation energy and dosage that form shallow n-type implant relative to the deep p-type implants;

masking the drift region at the surface of the silicon carbide substrate to define a second pair of openings on the drift region, a respective one of which is spaced apart from a respective shallow n-type implant and opposite the aluminum well;

implanting n-type dopants into the silicon carbide substrate through the second pair of openings to define a pair of drain regions;

annealing at temperature and time that is sufficient to laterally diffuse the respective deep p-type implants to the surface of the silicon carbide substrate surrounding the respective shallow n-type implants, without vertically diffusing the respective deep p-type implants to the surface of the silicon carbide substrate through the respective shallow n-type implants, to thereby form a pair of channel regions in the laterally diffused p-type implants at the surface of the silicon carbide substrate, a respective one of which is on a respective opposite side of the aluminum well;

forming a pair of gate insulating regions on the drift region at the surface of the silicon carbide substrate, a respective one of which contacts a respective one of the pair of channel regions; and forming a common source contact, a pair of drain contacts and a pair of gate contacts on the shallow n-type implants and the aluminum well therebetween, on the drain regions, and on the pair of gate insulating regions, respectively.

14. A method according to claim 13:

wherein the step of first implanting p-type dopants comprises the step of implanting p-type dopants into the drift region at the face of the silicon carbide substrate through the first pair of openings at a plurality of implantation energies and dosages that form deep p-type implants; and wherein the step of then implanting n-type dopants comprises the step of then implanting n-type dopants into the drift region at the face of the silicon carbide substrate through the first pair of openings at a plurality of implantation energies and dosages that form shallow n-type implants relative to the deep p-type implants.

15. A method according to claim 14:

wherein the step of first implanting p-type dopants comprises the step of implanting boron into the drift region at the face of the silicon carbide substrate through the first pair of openings at a plurality of implantation energies and dosages that form deep p-type implants; and wherein the step of then implanting n-type dopants comprises the step of then implanting nitrogen into the drift region at the face of the silicon carbide substrate through the first pair of openings at a plurality of implantation energies and dosages that form shallow n-type implants relative to the deep p-type implants.

16. A method according to claim 14:

wherein the step of first implanting p-type dopants comprises the step of implanting beryllium into the drift region at the face of the silicon carbide substrate through the first pair of openings at a plurality of implantation energies and dosages that form deep p-type implants; and wherein the step of then implanting n-type dopants comprises the step of then implanting nitrogen into the drift region at the face of the silicon carbide substrate through the first pair of openings at a plurality of implantation energies and dosages that form shallow n-type implants relative to the deep p-type implants.

17. A method according to claim 13 wherein the step of first implanting p-type dopants comprises the step of implanting boron and wherein the step of then implanting n-type dopants comprises the step of implanting nitrogen.

18. A method according to claim 13 wherein the step of first implanting p-type dopants comprises the step of implanting beryllium and wherein the step of then implanting n-type dopants comprises the step of implanting nitrogen.

19. A method according to claim 13 wherein the step of implanting an aluminum well follows the step of then implanting n-type dopants, such that the aluminum well is implanted between the shallow n-type implants.

20. A method according to claim 13 wherein the steps of first implanting p-type dopants and then implanting n-type dopants are performed after the step of implanting n-type dopants, such that a pair of drain regions are formed prior to forming the deep p-type implants and the shallow n-type implants.

21. A method according to claim 13 wherein the steps of then implanting n-type dopants and implanting n-type dopants are performed simultaneously, such that the shallow n-type dopants and the pair of drain regions are formed simultaneously.

22. A method of fabricating a silicon carbide lateral power MOSFET comprising the steps of:

implanting an aluminum well into a drift region at a surface of a silicon carbide substrate;

masking the drift region at the surface of the silicon carbide substrate to define a first pair of openings on the drift region, a respective one of which is on a respective opposite side of the aluminum well;

first implanting n-type dopants into the silicon carbide substrate through the first pair of openings at implantation energy and dosage that form shallow n-type implants;

electrically activating the n-type dopants;

then implanting p-type dopants into the silicon carbide substrate through the first pair of openings at implantation energy and dosage that form deep p-type implants relative to the shallow n-type implants;

masking the drift region at the surface of the silicon carbide substrate to define a second pair of openings on the drift region, a respective one of which is spaced apart from a respective shallow n-type implant and opposite the aluminum well;

implanting n-type dopants into the silicon carbide substrate through the second pair of openings to define a pair of drain regions;

annealing at temperature and time that is sufficient to laterally diffuse the respective deep p-type implants to the surface of the silicon carbide substrate surrounding the respective shallow n-type implants, without vertically diffusing the respective deep p-type implants to the surface of the silicon carbide substrate through the respective shallow n-type implants, to thereby form a pair of channel regions in the laterally diffused p-type implants at the surface of the silicon carbide substrate, a respective one of which is on a respective opposite side of the aluminum well;

forming a pair of gate insulating regions on the drift region at the surface of the silicon carbide substrate, a respective one of which contacts a respective one of the pair of channel regions; and forming a common source contact, a pair of drain contacts and a pair of gate contacts on the shallow n-type implants and the aluminum well therebetween, on the drain regions, and on the pair of gate insulating regions, respectively.

23. A method according to claim 22:

wherein the step of first implanting n-type dopants comprises the step of implanting n-type dopants into the drift region at the face of the silicon carbide substrate through the first pair of openings at a plurality of implantation energies and dosages that form shallow n-type implants; and wherein the step of then implanting p-type dopants comprises the step of then implanting p-type dopants into the drift region at the face of the silicon carbide substrate through the first pair of openings at a plurality of implantation energies and dosages that form deep p-type implants relative to the shallow n-type implants.

24. A method according to claim 23:

wherein the step of first implanting n-type dopants comprises the step of implanting nitrogen into the drift region at the face of the silicon carbide substrate through the first pair of openings at a plurality of implantation energies and dosages that form shallow n-type implants; and wherein the step of then implanting p-type dopants comprises the step of then implanting boron into the drift region at the face of the silicon carbide substrate through the first pair of openings at a plurality of implantation energies and dosages that form deep p-type implants relative to the shallow n-type implants.

25. A method according to claim 23:

wherein the step of first implanting n-type dopants comprises the step of implanting nitrogen into the drift region at the face of the silicon carbide substrate through the first pair of openings at a plurality of implantation energies and dosages that form shallow n-type implants; and wherein the step of then implanting p-type dopants comprises the step of then implanting beryllium into the drift region at the face of the silicon carbide substrate through the first pair of openings at a plurality of implantation energies and dosages that form deep p-type implants relative to the shallow n-type implants.

26. A method according to claim 22 wherein the step of first implanting n-type dopants comprises the step of implanting nitrogen and wherein the step of then implanting p-type dopants comprises the step of implanting boron.

27. A method according to claim 22 wherein the step of first implanting n-type dopants comprises the step of implanting nitrogen and wherein the step of then implanting p-type dopants comprises the step of implanting beryllium.

28. A method according to claim 22 wherein the step of implanting an aluminum well follows the step of then implanting n-type dopants, such that the aluminum well is implanted between the shallow n-type implants.

29. A method according to claim 22 wherein the steps of first implanting p-type dopants and then implanting n-type dopants are performed after the step of implanting n-type dopants, such that a pair of drain regions are formed prior to forming the deep p-type implants and the shallow n-type implants.

30. A method according to claim 22 wherein the steps of first implanting n-type dopants and implanting n-type dopants are performed simultaneously, such that the shallow n-type dopants and the pair of drain regions are formed simultaneously.

31. A method of fabricating a silicon carbide vertical power MOSFET comprising the steps of:

implanting a pair of spaced apart aluminum wells into a drift region at a surface of a silicon carbide substrate;

masking the drift region at the surface of the silicon carbide substrate to define a first pair of openings on the drift region, between the pair of the aluminum wells;

first implanting p-type dopants into the silicon carbide substrate through the first pair of openings at implantation energy and dosage that form deep p-type implants;

then implanting n-type dopants into the silicon carbide substrate through the first pair of openings at implantation energy and dosage that form shallow n-type implants relative to the deep p-type implants;

annealing at temperature and time that is sufficient to laterally diffuse the respective deep p-type implants to the surface of the silicon carbide substrate surrounding the respective shallow n-type implants, without vertically diffusing the respective deep p-type implants to the surface of the silicon carbide substrate through the respective shallow n-type implants, to thereby form a pair of channel regions in the laterally diffused p-type implants at the surface of the silicon carbide substrate, between the shallow n-type implants;

forming a gate insulating region at the surface of the silicon carbide substrate extending on and between the pair of channel regions;

forming a pair of source contacts, a gate contact and a drain contact on the respective shallow n-type implants and extending on the aluminum well adjacent thereto, on the gate insulating region, and on a second face of the silicon carbide substrate opposite the drift region, respectively.

32. A method according to claim 31:

wherein the step of first implanting p-type dopants comprises the step of implanting p-type dopants into the drift region at the face of the silicon carbide substrate through the first pair of openings at a plurality of implantation energies and dosages that form deep p-type implants; and wherein the step of then implanting n-type dopants comprises the step of then implanting n-type dopants into the drift region at the face of the silicon carbide substrate through the first pair of openings at a plurality of implantation energies and dosages that form shallow n-type implants relative to the deep p-type implants.

33. A method according to claim 32:

wherein the step of first implanting p-type dopants comprises the step of implanting boron into the drift region at the face of the silicon carbide substrate through the first pair of openings at a plurality of implantation energies and dosages that form deep p-type implants; and wherein the step of then implanting n-type dopants comprises the step of then implanting nitrogen into the drift region at the face of the silicon carbide substrate through the first pair of openings at a plurality of implantation energies and dosages that form shallow n-type implants relative to the deep p-type implants.

34. A method according to claim 32:

wherein the step of first implanting p-type dopants comprises the step of implanting beryllium into the drift region at the face of the silicon carbide substrate through the first pair of openings at a plurality of implantation energies and dosages that form deep p-type implants; and wherein the step of then implanting n-type dopants comprises the step of then implanting nitrogen into the drift region at the face of the silicon carbide substrate through the first pair of openings at a plurality of implantation energies and dosages that form shallow n-type implants relative to the deep p-type implants.

35. A method according to claim 31 wherein the step of first implanting p-type dopants comprises the step of implanting boron and wherein the step of then implanting n-type dopants comprises the step of implanting nitrogen.

36. A method according to claim 31 wherein the step of first implanting p-type dopants comprises the step of implanting beryllium and wherein the step of then implanting n-type dopants comprises the step of implanting nitrogen.

37. A method according to claim 31 wherein the step of implanting a pair of spaced apart aluminum wells follows the step of then implanting n-type dopants, such that the aluminum wells are implanted outside the shallow n-type implants.

38. A method of fabricating a silicon carbide vertical power MOSFET comprising the steps of:

implanting a pair of spaced apart aluminum wells into a drift region at a surface of a silicon carbide substrate;

masking the drift region at the surface of the silicon carbide substrate to define a first pair of openings on the drift region, between the pair of the aluminum wells;

first implanting n-type dopants into the silicon carbide substrate through the first pair of openings at implantation energy and dosage that form shallow n-type implants;

electrically activating the n-type dopants;

then implanting p-type dopants into the silicon carbide substrate through the first pair of openings at implantation energy and dosage that form deep p-type implants relative to the shallow n-type implants;

annealing at temperature and time that is sufficient to laterally diffuse the respective deep p-type implants to the surface of the silicon carbide substrate surrounding the respective shallow n-type implants, without vertically diffusing the respective deep p-type implants to the surface of the silicon carbide substrate through the respective shallow n-type implants, to thereby form a pair of channel regions in the laterally diffused p-type implants at the surface of the silicon carbide substrate, between the shallow n-type implants;

forming a gate insulating region at the surface of the silicon carbide substrate extending one and between the pair of channel regions;

forming a pair of source contacts, a gate contact and a drain contact on the respective shallow n-type implants and extending on the aluminum well adjacent thereto, on the gate insulating region, and on a second face of the silicon carbide substrate opposite the drift region, respectively.

39. A method according to claim 38:

wherein the step of first implanting n-type dopants comprises the step of implanting n-type dopants into the drift region at the face of the silicon carbide substrate through the first pair of openings at a plurality of implantation energies and dosages that form shallow n-type implants; and wherein the step of then implanting p-type dopants comprises the step of then implanting p-type dopants into the drift region at the face of the silicon carbide substrate through the first pair of openings at a plurality of implantation energies and dosages that form deep p-type implants relative to the shallow n-type implants.

40. A method according to claim 39:

wherein the step of first implanting n-type dopants comprises the step of implanting nitrogen into the drift region at the face of the silicon carbide substrate through the first pair of openings at a plurality of implantation energies and dosages that form shallow n-type implants; and wherein the step of then implanting p-type dopants comprises the step of then implanting boron into the drift region at the face of the silicon carbide substrate through the first pair of openings at a plurality of implantation energies and dosages that form deep p-type implants relative to the shallow n-type implants.

41. A method according to claim 39:

wherein the step of first implanting n-type dopants comprises the step of implanting nitrogen into the drift region at the face of the silicon carbide substrate through the first pair of openings at a plurality of implantation energies and dosages that form shallow n-type implants; and wherein the step of then implanting p-type dopants comprises the step of then implanting beryllium into the drift region at the face of the silicon carbide substrate through the first pair of openings at a plurality of implantation energies and dosages that form deep p-type implants relative to the shallow n-type implants.

42. A method according to claim 38 wherein the step of first implanting n-type dopants comprises the step of implanting nitrogen and wherein the step of then implanting p-type dopants comprises the step of implanting boron.

43. A method according to claim 38 wherein the step of first implanting n-type dopants comprises the step of implanting nitrogen and wherein the step of then implanting p-type dopants comprises the step of implanting beryllium.

44. A method according to claim 38 wherein the step of implanting a pair of spaced apart aluminum wells follows the step of then implanting n-type dopants, such that the aluminum wells are implanted outside the shallow n-type implants.

45. A method according to claim 1 wherein the step of implanting a p-type well follows the step of first implanting p-type dopants.

46. A method according to claim 7 wherein the step of implanting a p-type well precedes the step of first implanting n-type dopants.

* * * * *